US008901690B2

(12) United States Patent
Popp et al.

(10) Patent No.: US 8,901,690 B2
(45) Date of Patent: Dec. 2, 2014

(54) SEMICONDUCTOR STRUCTURE FOR PHOTON DETECTION

(75) Inventors: Martin Popp, Chur (CH); Beat De Coi, Sargans (CH); Marco Annese, Chur (CH)

(73) Assignee: ESPROS Photonics AG, Sargans (CH)

( * ) Notice: Subject to any disclaimer, the term of this patent is extended or adjusted under 35 U.S.C. 154(b) by 0 days.

(21) Appl. No.: 13/551,732

(22) Filed: Jul. 18, 2012

(65) Prior Publication Data

US 2013/0037899 A1  Feb. 14, 2013

Related U.S. Application Data

(60) Provisional application No. 61/530,466, filed on Sep. 2, 2011.

(30) Foreign Application Priority Data

Jul. 22, 2011  (EP) .................................... 11006012

(51) Int. Cl.
| H01L 27/146 | (2006.01) |
| H01L 27/148 | (2006.01) |
| H01L 31/18 | (2006.01) |
| H01L 31/0216 | (2014.01) |
| H01L 31/0232 | (2014.01) |
| H01L 31/101 | (2006.01) |

(52) U.S. Cl.
CPC .................................. H01L 27/1463 (2013.01)
USPC .... 257/429; 257/432; 257/462; 257/E31.054; 257/E21.642; 438/73; 438/309

(58) Field of Classification Search
USPC .................. 257/432, 462, E31.054, E21.642, 257/E27.065, E27.131, E27.133, E31.097; 438/73, 309
See application file for complete search history.

(56) References Cited

U.S. PATENT DOCUMENTS 5,021,854 A * 6/1991 Huth .............................. 257/438
5,786,609 A 7/1998 Kemmer et al.
(Continued)

FOREIGN PATENT DOCUMENTS

| EP | 1 995 783 A2 | 11/2008 |
| JP | 2005-150521 A1 | 6/2005 |
| WO | 2010/053881 A1 | 5/2010 |

OTHER PUBLICATIONS

D.E. Groom, et al., "*Back-Illuminated, Fully-Depleted CCD Image Sensors for Use in Optical and Near-IR Astronomy*," Nuclear Instruments & Methods in Physics Research, Section A: Accelerators, Spectrometers, Detectors, and Associated Equipment, Elsevier BV, North Holland, NL, Bd. 442, Nr. 1-3, Mar. 1, 2000, pp. 216-222.

(Continued)

*Primary Examiner* — Shaun Campbell
*Assistant Examiner* — Thai T Vuong
(74) *Attorney, Agent, or Firm* — Burr & Brown, PLLC

(57) ABSTRACT

A semiconductor structure for photon detection, comprising a substrate composed of a semiconductor material having a first doping, a contact region fitted at the frontside of the substrate, a bias layer composed of a semiconductor material having a second doping, which is arranged on the backside of the substrate at a distance from the contact region, wherein the contact region at least partly lies opposite the bias layer, such that an overlap region is present in a lateral direction, a guard ring, which is arranged at the frontside of the substrate and surrounds the contact region, wherein a reverse voltage can be applied between the contact region and the guard ring. In order to enable more cost-effective production, the overlap region has a lateral extent amounting to at least one quarter of the distance between contact region and bias layer.

16 Claims, 7 Drawing Sheets

(56) References Cited

U.S. PATENT DOCUMENTS

| | | |
|---|---|---|
| 6,858,912 B2 * | 2/2005 | Marshall et al. ............... 257/438 |
| 7,576,371 B1 * | 8/2009 | Goushcha ..................... 257/184 |
| 2002/0024058 A1 * | 2/2002 | Marshall et al. ............... 257/170 |
| 2005/0051861 A1 * | 3/2005 | Shi et al. ....................... 257/438 |
| 2005/0258340 A1 * | 11/2005 | Glasper et al. .............. 250/214.1 |
| 2007/0170537 A1 * | 7/2007 | Poenar et al. ................. 257/462 |
| 2008/0265295 A1 * | 10/2008 | Brady ........................... 257/291 |
| 2009/0121306 A1 * | 5/2009 | Ishikawa ....................... 257/438 |
| 2009/0184384 A1 * | 7/2009 | Sanfilippo et al. ............. 257/432 |
| 2010/0014675 A1 | 1/2010 | Sniffen et al. |
| 2010/0148040 A1 * | 6/2010 | Sanfilippo et al. .......... 250/214.1 |
| 2012/0080765 A1 * | 4/2012 | Ku et al. ........................ 257/432 |
| 2012/0199901 A1 * | 8/2012 | Nagata .......................... 257/330 |
| 2012/0205731 A1 * | 8/2012 | Henderson et al. ............ 257/292 |

OTHER PUBLICATIONS

European Search Report dated Jun. 1, 2012.

* cited by examiner

SEMICONDUCTOR STRUCTURE FOR PHOTON DETECTION

CROSS REFERENCE TO RELATED APPLICATIONS

This application claims the benefit under 35 USC §119(a)-(d) of European Application No. 11 006 012.6 filed Jul. 22, 2011, and claims the benefit under 35 U.S.C. §119(e) of U.S. Provisional Application 61/530,466, filed Sep. 2, 2011, the entireties of which are incorporated herein by reference.

BACKGROUND OF THE INVENTION

1. Field of the Invention

The invention relates to a semiconductor structure for photon detection.

2. Description of Related Art

The prior art, for example by virtue of U.S. Pat. No. 5,786,609 A, discloses a semiconductor detector having a unipolar structure and also a "return electrode" embodied as a layer at the underside, the electrode being designed to extract the conduction carriers from the depletion zone.

SUMMARY OF THE INVENTION

It is an object of the invention to provide a semiconductor structure for photon detection which enables a cost saving during production.

Accordingly, a semiconductor structure for photon detection according to the invention, comprising: a substrate composed of a semiconductor material having a first doping, a contact region fitted at the frontside of the substrate, a bias layer composed of a semiconductor material having a second doping, which is arranged on the backside of the substrate at a distance from the contact region, wherein the contact region at least partly lies opposite the bias layer, such that an overlap region is present in a lateral direction, a guard ring, which is arranged on the frontside of the substrate and surrounds the contact region, wherein a reverse voltage can be applied between the contact region and the guard ring, is distinguished by the fact that the overlap region has a lateral extent amounting to at least one quarter of the distance between the contact region and the bias layer.

The guard ring is a type of protective structure which, by virtue of the potential applied to it, can shield the contact region from the surroundings thereof or from further semiconductor structures. Inter alia, in particular stray charge carriers can also be intercepted; this also makes it possible to reduce the parasitic resistances.

In the case of the semiconductor structure according to the invention, the guard ring makes it possible for depletion to take place laterally with respect to the guard ring, that is to say that a depletion zone can be formed, such that the contact region is shielded from other regions such as, if appropriate, CMOS structures or sensor structures.

If the contact region is formed for example merely by a metal contact being applied to the substrate, the distance between the contact region and the bias layer can correspond to the thickness of the substrate.

The bias layer is correspondingly formed on the backside of the substrate. The overlap region within the meaning of the invention is the region in which the contact region in lateral extent extends over the bias layer.

The semiconductor structure can preferably be used as a photodetector. In particular, it can serve as a photodetector for the infrared range. The bias layer on the backside can serve for producing a depletion zone between regions on the frontside having a doping of the first type (substrate contact) and the bias layer. If an electron-hole pair is generated as a result of the absorption of a photon in said depletion zone, then they are separated on account of the electric field in the depletion zone. In particular, it is possible to detect the electrons in the substrate contact on the frontside of the substrate.

In particular, by virtue of the semiconductor structure according to the invention, a cost saving can be achieved by virtue of the fact that the bias layer on the backside does not have to be specially contact-connected. Usually, for such a contact-connection of said layer on the backside, which, in the case of commercially available semiconductor structures, can be formed from metal, in particular, a wire is bonded on or a through-silicon via (TSV) is produced. However, this production can lead to high costs. However, a contact-connection of this type can be avoided in the case of the semiconductor structure according to the invention. On account of the measure that the minimum lateral extent by which the overlap region is formed amounts to is greater than one quarter of the substrate thickness or of the distance between the contact region and the bias layer on the backside, the bias layer can be influenced.

In principle, during the production of a semiconductor structure of this type, a semiconductor material is regularly used for the corresponding substrate (e.g. germanium or silicon), while in different regions the doping can be formed differently during the production process, for instance a heavier or weaker doping and a doping of the same sign or opposite sign.

A further fundamental advantage of the semiconductor structure according to the invention is that the backside processing can be reduced during the semiconductor production, for instance in a process line. A further advantage of the semiconductor structure for photon detection according to the invention is that reduced voltages can be employed in order to be able to obtain a corresponding, sufficient depletion zone for detection purposes.

In one preferred development of the invention, the contact region is designed to the effect that the potential of the bias layer is influenced by the potential applied to the contact region. The contact region itself is surrounded by a guard ring, which is likewise arranged on the frontside of the substrate, and is shielded thereby. The reverse voltage itself is simultaneously applied between the contact region and the guard ring, that is to say that one pole of the corresponding voltage is applied to the contact region, and the other to the guard ring. The polarity of the voltage is dependent, inter alia, on the doping of the substrate or the rest of the semiconductor material. If the lateral extent were chosen to be less than one quarter of the thickness of the substrate, then the potential in the region of the bulk material of the substrate between the contact region and the bias layer on the backside would substantially be influenced by the guard ring voltage. By virtue of the fact, however, that the lateral extent is chosen to be greater than one quarter of the thickness, that is to say attains the order of magnitude of the substrate thickness, the potential, as the lateral extent increases, becomes more and more independent of the guard ring voltage. Finally, not just the potential in the bulk material is influenced by the potential applied to the contact region, but likewise the potential of the bias layer. A potential channel arises, a conduction channel between the contact region and the bias layer lying opposite.

The contact region can be formed by a metallic contact-connection on the substrate surface. Furthermore, however, the contact region can also comprise a well formed in the substrate. The well is correspondingly provided with a doping of opposite sign in comparison with the first doping, that is to say in comparison with the substrate. This also makes it possible that the contact region embodied as a well extends more deeply into the substrate and, consequently, by way of example, can influence the potential of the bias layer to an even greater extent.

In particular, it is possible, in one embodiment of the invention, for the semiconductor material having the doping of the first type, i.e. in particular the substrate, to be weakly doped, that is to say to be embodied with high impedance. The material is advantageous in particular for photon detection, that is to say for charge carrier separation during photon absorption.

Furthermore, in one preferred development of the invention, the doping of the second type is oppositely doped in comparison with the doping of the first type. By applying a corresponding reverse voltage, an influencing of the bias layer is achieved by virtue of the fact that the majority charge carriers are extracted by the potential. Consequently, a diode is formed. In this case, the bias layer has doping of opposite sign in comparison with the substrate.

In one embodiment of the invention, the guard ring in turn can have a doping of the same sign as the substrate, i.e. the semiconductor material having a doping of the first type. As a result of the contact-connection with the reverse voltage, the majority charge carriers of the guard ring are in turn extracted.

Furthermore, in one embodiment of the invention, the guard ring can be more heavily doped than the substrate. This heavier doping enables a particular shielding function which the guard ring is intended to exercise with regard to the contact region relative to the remaining regions.

In one preferred development of the invention, the semiconductor structure is embodied such that it can be illuminated from the backside. This backside illumination firstly makes it possible that photons can penetrate into the region of the depletion zone as advantageously as possible. If, moreover, the backside is prevented from being contact-connected or equipped with further components, the light can penetrate into the substrate with less hindrance, since no disturbing contacts, etc. are in the way on the path of the light. Therefore, inter alia, it is also possible to increase the efficiency of the semiconductor structure in photon detection.

In a further embodiment of the invention, at least one further region comprising at least one well composed of a material having the same sign of doping as the contact region can be arranged in a manner laterally offset with respect to the contact region. In particular, at least one further region can be embodied as a sensor component for detection, more particularly for detection of photons. Since these regions are arranged in a manner laterally offset with respect to the contact region, that is to say are situated on the frontside of the semiconductor structure, these are not in the way of the light in the case of backside illumination, if appropriate, such that a higher photon yield can be achieved.

Moreover, however, a region which is laterally offset with respect to the region below the contact region can also be utilized as a depletion zone and thus for photon detection. Therefore, this part of the bulk material is also utilized as an absorption region and becomes the depletion zone.

In one advantageous embodiment of the invention, the absorption region becomes the depletion zone when the reverse voltage is present.

In one preferred development of the invention, the substrate of the semiconductor structure is produced from float-zone silicon. This material is distinguished by very low defects and by particular homogeneity. The conductivity is from several hundred ohms×centimeter ($\Omega$cm) to several k$\Omega$ cm.

In particular, in one development of the invention, the semiconductor material having a doping of the first type or the substrate is weakly n-doped. A correspondingly weak doping leads to a high resistance of the material and to a low density of majority charge carriers.

In one advantageous embodiment of the invention, a shallow-trench isolation (STI) is partly arranged between the contact region and the guard ring and/or between the contact region and the at least one further region. A corresponding isolation leads to a further partitioning with regard to the corresponding potential, if this is necessary.

One particular advantage of the semiconductor structure according to the invention is that of being able to obtain a particularly good quantum efficiency, in particular in the near infrared range. This regularly necessitates providing a depletion zone of corresponding extent of the order of magnitude of a few micrometers ($\mu$m), since the absorption length in the silicon material is between 4 $\mu$m at a wavelength of the light of 750 nm and up to 200 $\mu$m at a wavelength of 1000 nm. In the case of commercially available photodiodes, this is achieved by means of a so-called pin structure (abbreviation of: positive-intrinsic-negative). This approach is unsuitable, however, in the case of photodetectors with integrated detection electronics. The extent of the depletion zone in the substrate is principally influenced by the doping within the substrate. Furthermore, it should be taken into consideration that the reverse voltage that can be applied to the frontside is limited and is typically of the order of magnitude of a few volts.

Photodetectors of this type have the disadvantage that the absorption length can be significantly greater than the extent of the depletion zone. Accordingly, it can happen that a large number of generated charge carriers arise during photon absorption outside the depletion zone in the bulk material. There, the minority charge carriers have only a short lifetime and are not exposed to an electric field, such that after the splitting of the charge carriers, the latter cannot be separated from one another rapidly enough and recombine again. On account of this recombination effect that arises when the corresponding electric field is not high enough to maintain a sufficient separation of the charge carriers or to enable a rapid extraction of charge carriers that counteracts the recombination, a corresponding portion of the split charge carriers will recombine again and is thus lost to the detection. Another portion of the generated charge carriers is subject to a lateral diffusion on account of the lacking electric field and is therefore finally detected elsewhere, namely not where it has actually been absorbed corresponding photons which led to the separation of the charge carriers (image blue). Moreover, a corresponding diffusion process of the charge carriers proceeds comparatively slowly, in principle, such that the corresponding time correlation during detection can be lost because the corresponding charge carriers diffuse away only slowly and, consequently, a corresponding time elapses between the separation of the charge carriers and the actual detection. These disadvantages described can be avoided or reduced by the semiconductor structure according to the invention. What can be achieved by providing a substrate having a correspondingly weak doping is that the depletion zone has a corresponding extent.

As has already been mentioned above, corresponding electronics for detection purposes can be applied on the frontside. This can involve typical CMOS structures. It is particularly advantageous to correspondingly shield these structures, in particular by means of a guard ring surrounding the contact region. This guard ring is also utilized for applying the reverse voltage. The corresponding shielding also brings about a shielding from noise or from additional effects as a result of the contact-connection of the contact region with regard to possible contact-connections of the further regions, for example of the CMOS structures. A depletion zone can be produced practically in the entire bulk material.

In order to facilitate the formation of a depletion zone or of a corresponding conduction channel below the contact region, a bias layer can be fitted on the backside, which has doping of opposite sign with respect to the semiconductor material having doping of the first type, that is to say the semiconductor material of the substrate. If the semiconductor material is weakly n-doped with doping of the first type, for example, then the bias layer is p-doped. The bias layer need not necessarily be contact-connected. However, it is also conceivable, in principle, additionally to provide for example a metal contact therefor, if appropriate also through the bulk material. However, this contact-connection can be avoided by the semiconductor structure according to the invention.

In particular, it is advantageously possible to use conventional process lines for wafer production which enable frontside processing, wafer thinning and possible backside processing. In this case, the so-called "frontside processing" can be effected according to a commercially available manner by production of dopings, for example by ion implantation, oxidation processes, metallizations, STI, passivations, etc. Resistors, transistors, etc. can thereby be constructed. Different regions can be formed by producing active structures and so-called STIs. The contact region in turn can be shielded by a guard ring from these regions with regard to its potential. The contact region can have a rectangular form or can be embodied in a ring-shaped fashion.

The guard rings can be formed for example by deeply extending implanted structures, for example by well structures.

Standard CMOS production processes can also be utilized in the further production method. The "wafer thinning process" can likewise be resolved in various ways.

The exemplary embodiment described below, the substrate is formed from a weakly doped n-type material obtained in the float-zone method, for example. The guard rings are formed by n-doped wells. The region outside the region within the guard rings shall be at the potential 0 (ground). A reverse voltage is applied, such that the guard ring is provided with a positive bias voltage. A depletion zone is thereby produced within the substrate. The contact region in turn is connected to a negative potential. Through the barrier produced by the positive bias voltage of the guard ring, practically no leakage current arises between the two differently doped regions in the substrate. On the other hand, the substrate itself is only weakly doped, such that only a very small potential barrier with regard to the backside pn junction endures. Accordingly, majority charge carriers of the bias layer, that is to say holes, can flow to the negative pole applied to the contact region. Accordingly, therefore, the negative bias voltage of the contact region likewise influences the bias layer. A "virtual" backside contact practically arises.

In principle, this mode of operation in the semiconductor material can remain unchanged even when, as a result of the absorption of photons, charge carrier separation takes place, that is to say that minority charge carriers arise. Specifically, outside the corresponding conduction channel, the holes flow rather in the direction of the backside since this is at a negative potential in comparison with the rest of the substrate. As a result in turn, the potential at the backside of the semiconductor structure is increased, namely from negative toward zero, which in turn lowers the barrier with regard to the junction between the bias layer and the contact region. Finally, a dynamic equilibrium is established, such that the backside remains at a substantially constant potential.

As a result of negative potential at the backside, namely at the bias layer, in particular holes are attracted or removed from the substrate. Moreover, the electric field is increased with regard to the bulk material, such that the flow time of the electrons can be significantly shortened. Consequently, a corresponding semiconductor structure according to the invention can also be used for applications in which time correlations are particularly of importance, that is to say those applications in which the detection has to be as close as possible to the photon absorption.

BRIEF DESCRIPTION OF THE DRAWINGS

Exemplary embodiments of the invention are illustrated in the drawings and are explained in greater detail below with further advantages and details being indicated.

FIG. 3);

FIGS. 3 and 4) with a schematic equivalent circuit diagram;

DETAILED DESCRIPTION OF THE INVENTION

Figure 1:
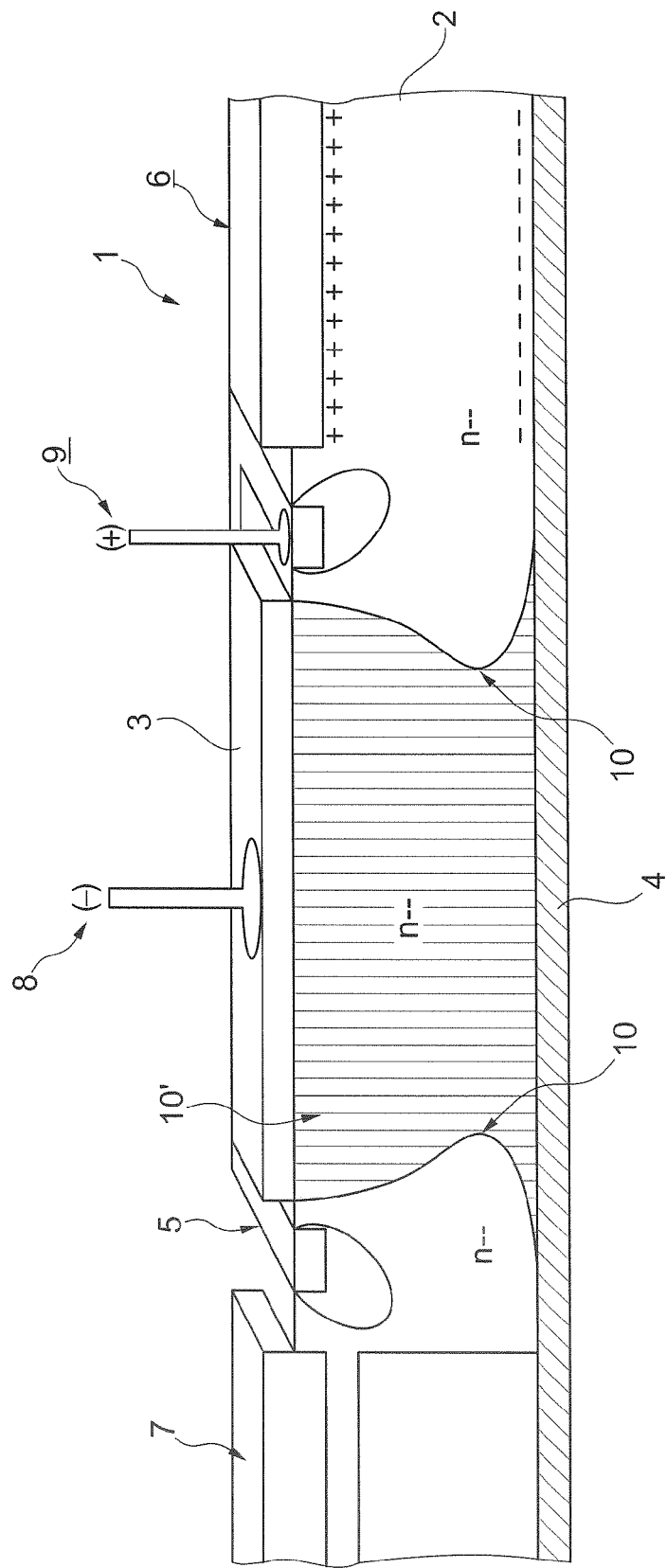
FIG. 1 shows a schematic illustration of a cross section through a typography of a photodetector according to the invention.

FIG. 1 shows a schematic section through a semiconductor structure of a photodetector 1. The latter comprises a substrate 2, to which a contact region 3 is applied. A bias layer 4 is situated on the backside of the substrate. A guard ring 5 is in turn arranged around the contact 3. A CCD sensor 6 and also a further CMOS region 7 are situated laterally offset with respect to the contact region 3. A reverse voltage is applied to the semiconductor structure 1 when contact region 3 is connected to the negative pole 8, while the guard ring 5 is connected to the positive pole 9. The polarity with which the reverse voltage is ultimately applied is dependent, inter alia, on the doping of the semiconductor structures. The substrate 2 is weakly n-doped. It consists of float-zone silicon.

The guard ring 5 in turn consists of an n-doped material, which is more heavily doped than the substrate. The bias layer 4 in turn on the backside of photodetector 1 is p-doped. Upon application of a reverse voltage in the manner mentioned above, a depletion zone forms in the substrate 2.

By virtue of the fact that the lateral extent of the contact region 3 is greater than one quarter of the substrate 2 thickness, the potential present at the contact region 3 can influence the potential of the bias layer 4. A type of conduction channel 10' arises, the course of which is indicated by the potential line contours 10. As a result of the negative pole being applied to the contact region 3, the holes originating, for example, from the p-doped bias layer 4 or from the charge carrier splitting brought about by photon absorption migrate in the direction of the negative pole 8. The semiconductor structure of photodetector 1 is furthermore embodied such that the pn junction between the substrate 2 and the bias layer 4 has a relatively low barrier, such that here, too, the holes can migrate in the direction of the negative pole 8. Since the positive pole 9 is applied to the n-doped guard ring 5, the majority charge carriers, the electrons, are extracted from the positive pole 9. The guard ring 5 in turn shields the contact region 3 from the CCD region 6 and the CMOS region 7, respectively. If a photon then passes into the photodetector 1 upon backside irradiation, it can be absorbed in the region of the depletion zone in the substrate 2 and split an electron-hole pair, wherein the hole can be extracted through the conduction channel 10' and the electron is available for signal detection.

Figure 2:
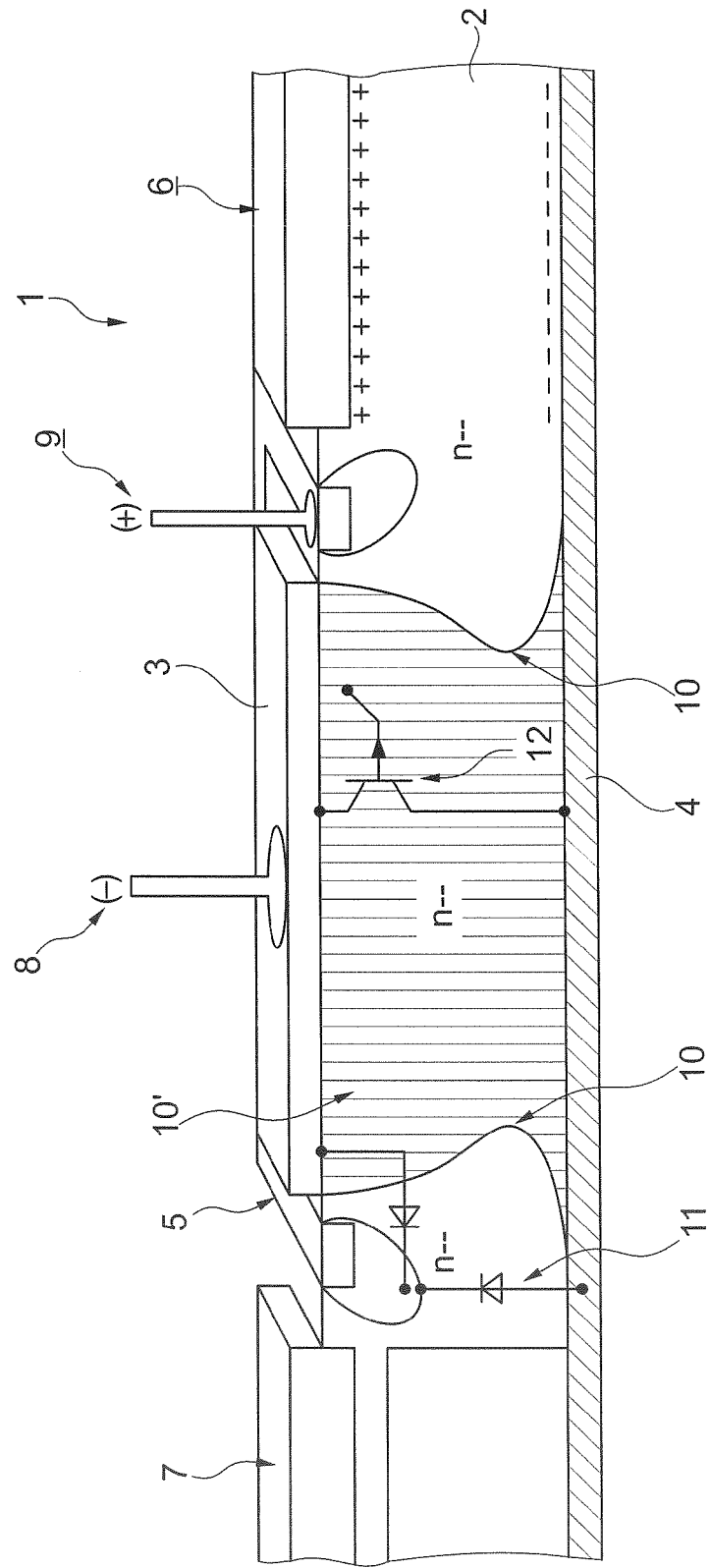
FIG. 2 shows a schematic illustration of a cross section through a typography of a photodetector according to the invention (with a schematic equivalent circuit diagram)

FIG. 2 shows a corresponding illustration similar to FIG. 1 with a type of schematic equivalent circuit diagram, merely for the purpose of understanding: the construction can be compared in a similar manner with a diode circuit 11 and with a transistor circuit 12.

Figure 3:
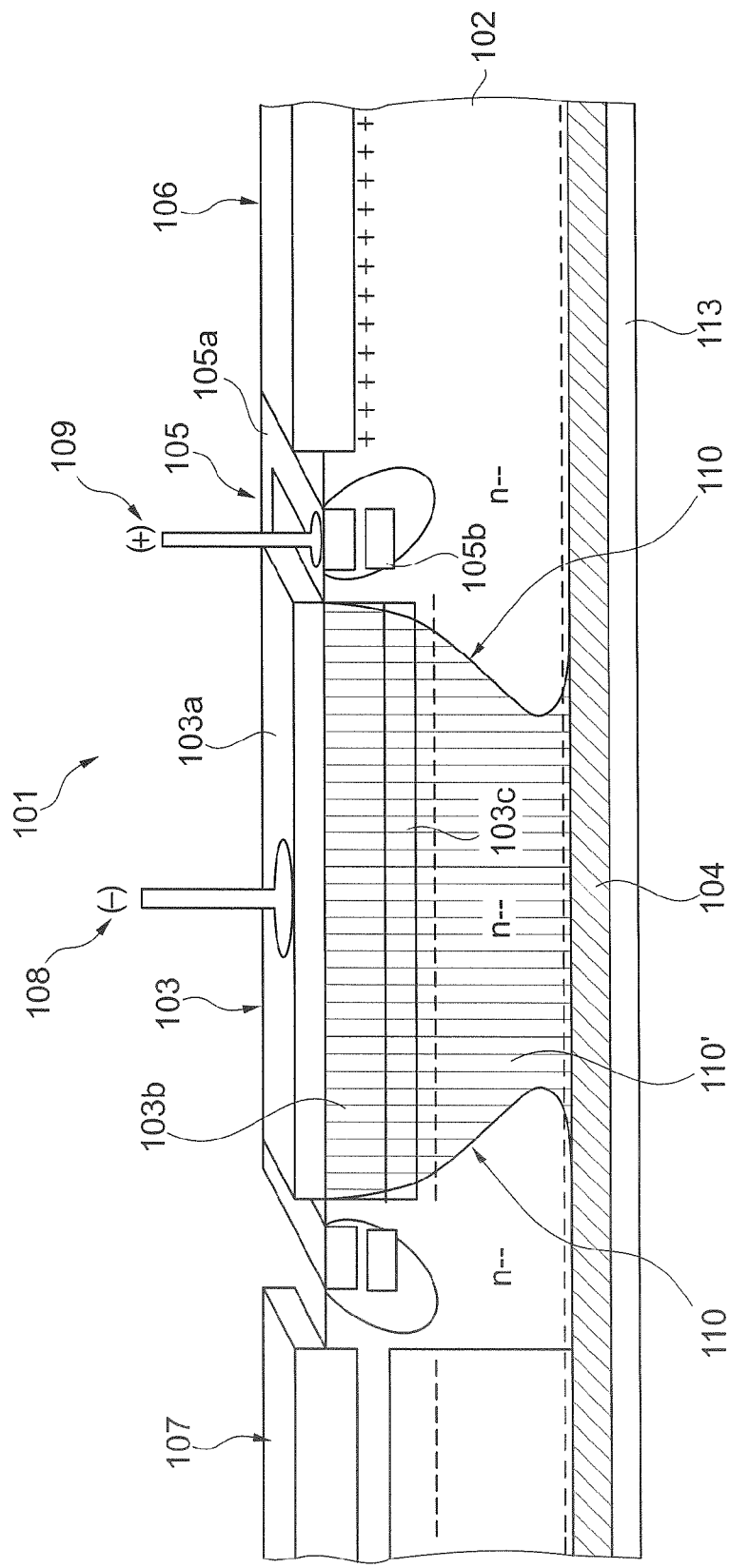
FIG. 3 shows a schematic illustration of a cross section through a typography of a photodetector according to the invention with a contact region comprising a p-type well.

FIG. 3 shows a similar construction for photodetector 101, in which, however, the contact region 103 consists of a metallic contact 103a, which is applied to the substrate 102, and furthermore of a highly doped p-type well 103b and a likewise heavily doped (p+) layer 103c situated underneath. The substrate 102 consists of weakly n-doped n-type material obtained in the float-zone method. The guard ring 105 in turn comprises a heavily n-doped layer 105a and a further buried n-doped layer 105b situated underneath. The bias layer 104 on the backside is heavily p-doped. It has applied on it in turn a passivation 113, which serves for sealing the surface. By way of example, the use of a silicate glass for passivation is conceivable.

As a result of applying the negative pole 108 to the contact region 103, the holes situated there, the majority charge carriers of the p-type well 103b material, are extracted. An analogous situation, namely the extraction of electrons, occurs as a result of the positive pole 109 being applied to the guard ring 105. As a result of the wide lateral extent of the contact region 103 in comparison with the distance between the contact region 103 and the bias layer 104, a conduction channel 110' forms, which is respectively indicated by the potential line contours 110. Furthermore, a CCD electronic unit 106 and further CMOS regions 107 are likewise situated to be laterally offset from the contact region 103.

Figure 4:
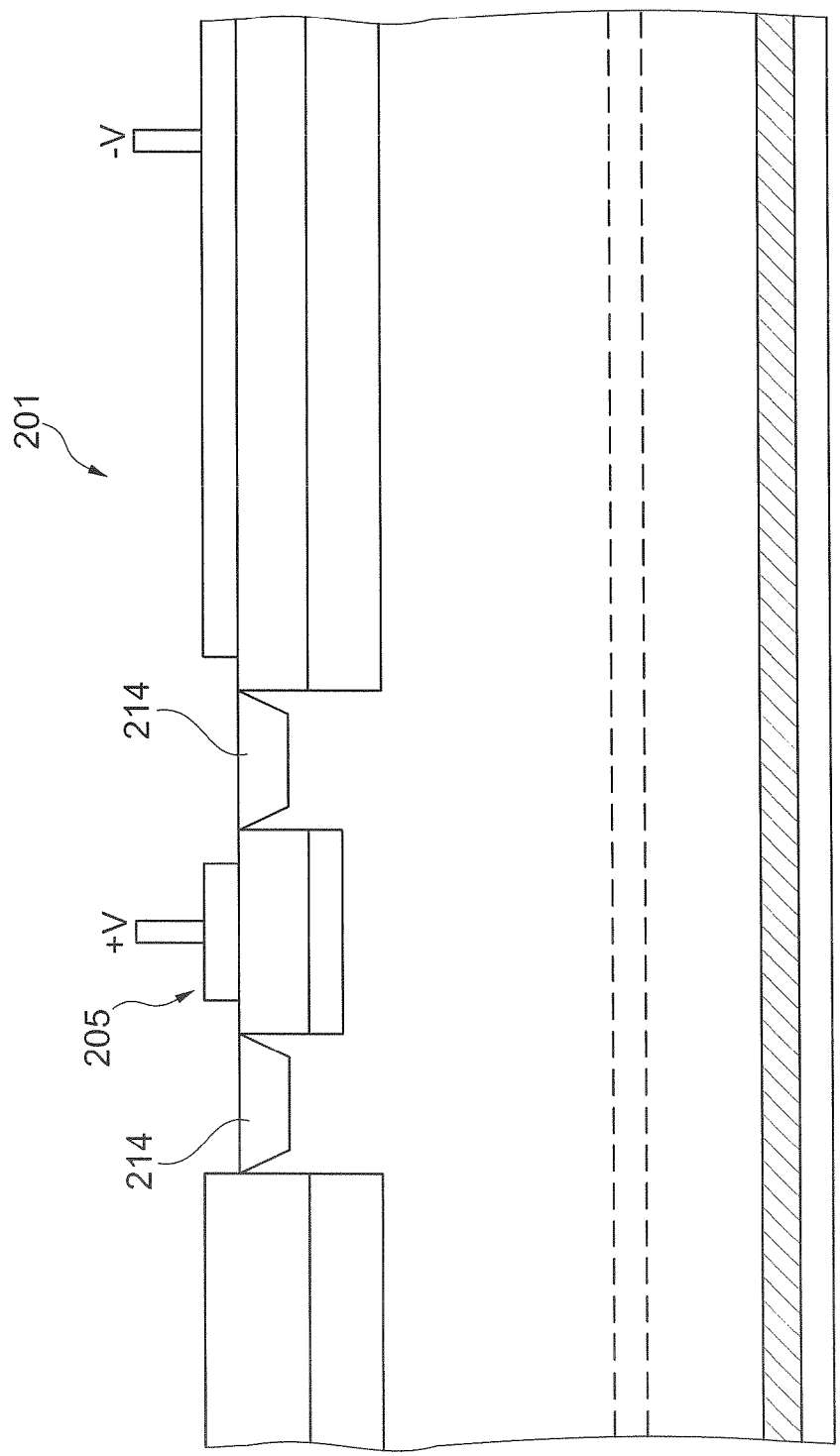
FIG. 4 shows a schematic illustration of a cross section through a further typography of a photodetector according to the invention.
Figure 5:
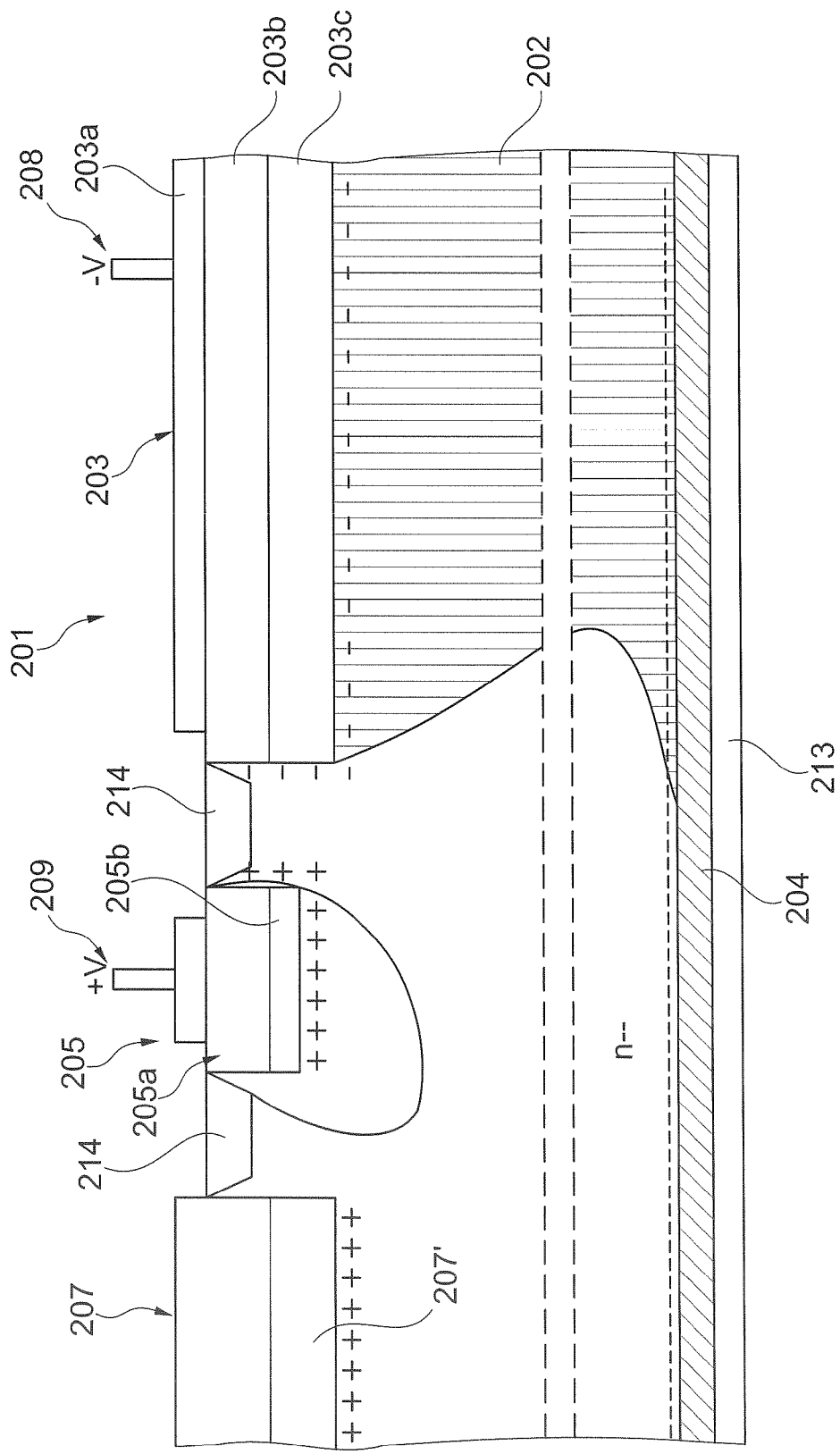
FIG. 5 shows a further schematic illustration of a cross section through a typography of a photodetector according to the invention (cf.
Figure 6:
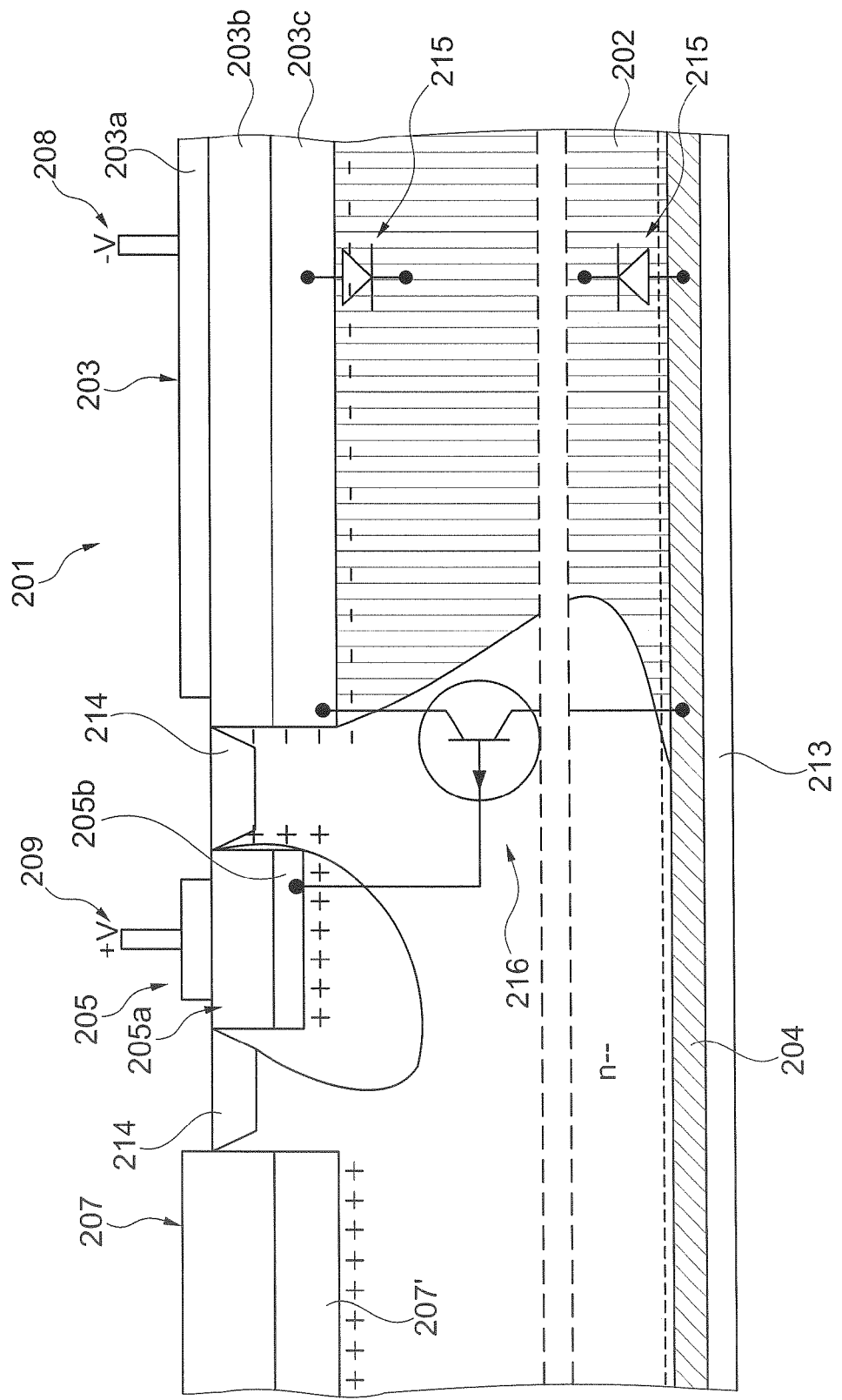
FIG. 6 shows a schematic illustration of a cross section through a typography of a photodetector according to the invention (cf.

A further structure of a corresponding photodetector 201 is illustrated in FIGS. 4 to 6. The photodetector 201 likewise comprises a contact region 203 having a metallic contact 203a with a heavily doped p-type well 203b situated underneath and a further p-doped layer 203c situated underneath.

The actual substrate 202 in turn is weakly n-doped. The contact region 203 is surrounded by a guard ring 205. The guard ring 205 comprises a metallic contact-connection of a heavily n-doped well 205a and a further n-doped layer 205b lying below the well. Furthermore, a bias layer 204, which is heavily p-doped, is applied on the backside, and a passivation layer 213 is also applied. A corresponding CMOS structure 207 having likewise a shielding, p-doped layer 207' situated underneath is likewise present. In contrast to the previous structures, in particular the guard ring 205 is surrounded by a shallow-trench isolation (STI) 214 on the inner side (that is to say toward the contact region) and on the outer side (that is to say toward the further regions such as, for example, in the CMOS region). This STI structure serves for greater delimitation of the individual regions. The structure is contact-connected in the usual way, that is to say that the negative pole 208 is applied to the contact region 203, while the positive pole 209 is applied to the guard ring 205.

Schematic diode equivalent circuit diagram 215 and transistor equivalent circuit diagram 216 are inserted in FIG. 6, merely for the sake of better elucidation. The equivalent diodes in the diode equivalent circuit diagrams 215 (right side of FIG. 6) are connected back-to-back correspondingly illustrate the formation of a depletion zone.

Figure 7:
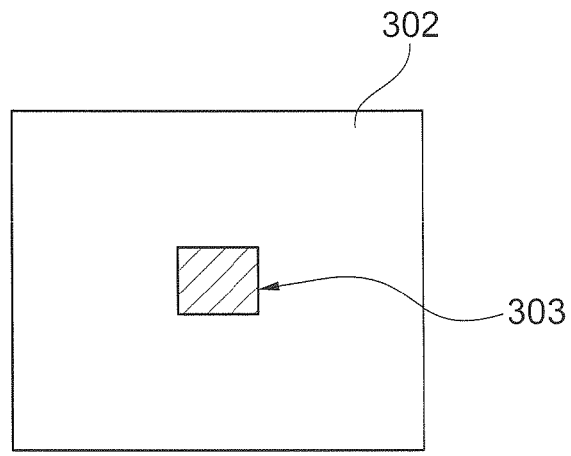
FIG. 7 shows a schematic illustration of the arrangement of a contact region on a substrate.
Figure 8:
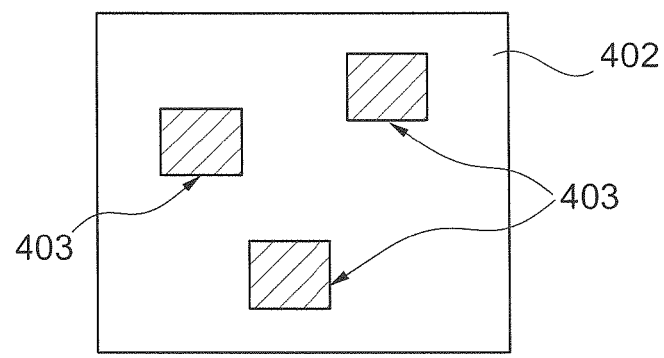
FIG. 8 shows a schematic illustration of the arrangement of a plurality of contact regions on a substrate.
Figure 9:
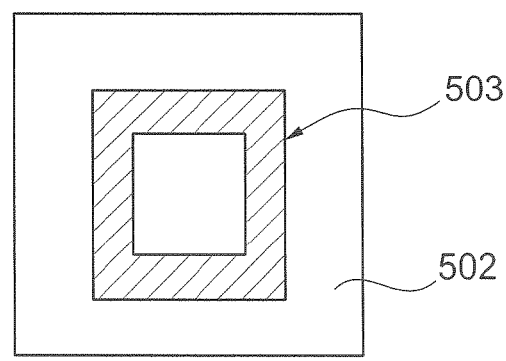
FIG. 9 shows a schematic illustration of a ring-shaped contact region on a substrate.

Furthermore, FIGS. 7, 8 and 9 illustrate examples of how contact regions 303, 403, 503 can be arranged and embodied with regard to their form. FIG. 7 shows a substrate 302 of a semiconductor structure in plan view with an individual contact region 303 embodied in punctiform fashion and fitted at the frontside. FIG. 8 in turn shows a plurality of punctiform contact regions 403 on a substrate 402. FIG. 9 shows a ring-shaped contact region 503 on a substrate 502.

To summarize, a particularly preferred semiconductor structure for photon detection is constructed as follows.

It has a high-impedance substrate produced from float-zone silicon with a resistivity $\rho > 2000$ $\Omega$cm. This semi-intrinsic semiconductor material is e.g. correspondingly (n--)-doped. This substrate is thinned to a thickness of approximately 50 μm.

Moreover, the semiconductor has a contact region at the frontside of the substrate. A format of 50 μm×200 μm comes into consideration, in particular. If, as in the present case, a weakly n-doped substrate is chosen, the contact region comprises a so-called p-source/drain implantation composed of a (p++)-doped material (sheet resistivity approximately 100Ω or 100 Ω/sq., arranged in the range of from 0 nm to approximately 100 nm), additionally a p-type well implantation having a (p+)-doped layer (sheet resistivity: approximately 1000 Ω/sq., arranged in the range of from approximately 0.1 μm to 1.0 μm depth). The p-type well is designed such that a potential of −1 V to −5 V can be applied. In addition, a p-type subimplantation is provided, which from a (p+)-doped region (sheet resistivity of approximately 1000 Ω/sq., arranged at a depth of approximately 0.7 μm to 1.5 μm).

The guard ring is likewise formed on the frontside of the substrate and surrounds the contact region. The width of the guard ring is preferably approximately 10 μm, and the distance from the contact region likewise approximately 10 μm. Furthermore, a shallow-trench isolation (STI) having a width of 10 μm is preferably provided within and outside the guard ring. The guard ring correspondingly comprises an n-type source/drain implantation composed of (n++)-doped material having a sheet resistivity of less than 100 Ω/sq. and a depth from the surface of 100 nm. Moreover, the guard ring structure comprises an n-type well implantation composed of (n+)-doped material (sheet resistivity: approximately 800 Ω/sq., depth approximately 0.7 μm to 1.5 μm, arranged in the range of 100 nm to 1000 nm depth). The n-type well implantation is embodied such that an isolating voltage of +5 V to +10 V can be applied. Furthermore, provision is made of an n-buried layer implant composed of an (n+)-doped material (sheet resistivity: approximately 1300 Ω/sq., depth: approximately 0.5 μm to 1.0 μm, lying in the range of 500 nm to 700 nm depth). No further layer is provided underneath, more particularly no direct contact-connection of the n-type guard ring to the substrate.

Furthermore, provision is made of a backside layer (i.e., bias layer 4, 104, 204), which is at a distance from the contact region, but forms a lateral overlap with the contact region. It comprises a p-type well implantation ((p+)-doped with a sheet resistivity of less than 1000 Ω/sq.) extending to a depth of 200 nm from the backside surface. At the surface, the backside layer is covered by an anti-reflective coating layer (ARC layer) composed of nitrides, ZbSiO or ZbSiNi. The backside layer is regularly homogeneously embodied, i.e. without structuring, and extends over the entire wafer region, if appropriate apart from a narrow edge region that is e.g. not thinned and is fitted on the backside.

LIST OF REFERENCE SIGNS

1 Photodetector
2 Substrate
3 Contact Region
4 Bias layer
5 Guard ring
6 CCD electronics unit
7 CMOS region
8 Negative pole
9 Positive pole
10 Potential lines
10' Conduction channel
11 Diode equivalent circuit diagram
12 Transistor equivalent circuit diagram
101 Photodetector
102 Substrate
103 Contact region
103a Metal contact
103b p-type well
103c (p+)-type layer
104 Bias layer
105 Guard ring
105a (n+)-type well
105h (n+)-type layer
106 CCD region
107 CMOS region
108 Negative pole
109 Positive pole
110 Potential line contours
100' Conduction channel
113 Passivation
201 Photodetector
202 Substrate
203 Contact region
203a Metal contact
203b p-type well
203c p-type layer
204 Bias layer
205 Guard ring
205a (n+)-type well
205b (n+)-type layer
207 CMOS region
207' p-type layer
208 Negative pole
209 Positive pole
213 Passivation
214 Shallow-trench isolation
215 Diode equivalent circuit diagram
216 Transistor equivalent circuit diagram
302 Substrate
303 Contact region
402 Substrate
403 Contact region
502 Substrate
503 Contact region

We claim:

1. A semiconductor structure for photon detection, comprising:
    a substrate composed of a semiconductor material having a doping of a first type;
    a contact region formed on a frontside of the substrate;
    a bias layer composed of a semiconductor material having a second doping, is arranged on a backside of the substrate and at a distance from the contact region, wherein the contact region lies opposite to at least part of the bias layer, such that an overlap region is formed to extend in a lateral direction of the substrate; and
    a guard ring, which is arranged on the frontside of the substrate, surrounds the contact region;
    wherein a reverse voltage can be applied between the contact region and the guard ring, and wherein the overlap region has a lateral extent amounting to at least one quarter of a distance between the contact region and the bias layer, and
    wherein the contact region comprises a metal contact connection and a semiconductor well region having doping of the first type of opposite sign to the substrate.

2. The semiconductor structure as claimed in claim 1, wherein the contact region influences a potential of the bias layer by means of the reverse voltage applied to the contact region.

3. The semiconductor structure as claimed in claim 1, wherein the distance between the contact region and the bias layer corresponds to a thickness of the substrate.

4. The semiconductor structure as claimed in claim 1, wherein the substrate has high impedance.

5. The semiconductor structure as claimed in claim 4, wherein the substrate is weakly doped.

6. The semiconductor structure as claimed in claim 1, wherein the contact region has a doping of opposite sign to the substrate.

7. The semiconductor structure as claimed in claim 1, wherein the bias layer has a doping of opposite sign to the substrate.

8. The semiconductor structure as claimed in claim 1, wherein the guard ring has a doping of the same sign as the substrate.

9. The semiconductor structure as claimed in claim 1, wherein the guard ring is more heavily doped than the substrate.

10. The semiconductor structure as claimed in claim 1, wherein the semiconductor structure is illuminated from the backside of the substrate.

11. The semiconductor structure as claimed in claim 1, wherein at least one further region further comprises at least one well composed of a material having the same sign of doping as the contact region that is arranged in a manner laterally offset with respect to the contact region.

12. The semiconductor structure as claimed in claim 11, wherein the at least one further region is a sensor component for detecting photons.

13. The semiconductor structure as claimed in claim 1, wherein the semiconductor structure further comprises an absorption region that enables photons to at least partly penetrate and be absorbed into the substrate, the absorption region being laterally offset with respect to the overlap region in the substrate.

14. The semiconductor structure as claimed in claim 13, wherein the absorption region forms a depletion zone when the reverse voltage is applied between the contact region and the bias layer.

15. The semiconductor structure as claimed in claim 1, wherein the substrate is formed from a float-zone silicon.

16. The semiconductor structure as claimed in claim 1, wherein a shallow-trench isolation is partly arranged between one of the contact region and the guard ring, aid the contact region and the at least one further region.

* * * * *